United States Patent [19]

Sobhani

[11] Patent Number: 5,525,065

[45] Date of Patent: Jun. 11, 1996

[54] CAVITY AND BUMP INTERCONNECTION STRUCTURE FOR ELECTRONIC PACKAGES

[75] Inventor: Mohi Sobhani, Encino, Calif.

[73] Assignee: Hughes Aircraft Company, Los Angeles, Calif.

[21] Appl. No.: 389,436

[22] Filed: Feb. 15, 1995

Related U.S. Application Data

[63] Continuation-in-part of Ser. No. 168,342, Dec. 17, 1993, abandoned.

[51] Int. Cl.⁶ .................................................. H01R 9/09
[52] U.S. Cl. ............................ 439/67; 29/831; 29/874
[58] Field of Search ................................. 439/67, 74, 493; 228/180.22; 29/846, 848, 849, 831, 874

[56] References Cited

U.S. PATENT DOCUMENTS

| | | | |
|---|---|---|---|
| 4,813,129 | 3/1989 | Karnezos | 29/832 |
| 4,940,181 | 7/1990 | Juskey, Jr. et al. | 228/180.21 |
| 5,071,363 | 12/1991 | Reylek et al. | 439/291 |
| 5,121,299 | 6/1992 | Frankeny et al. | 361/413 |
| 5,164,336 | 11/1992 | Ohno et al. | 228/180.22 |
| 5,197,184 | 3/1993 | Crumly et al. | 29/846 |
| 5,213,511 | 5/1993 | Sobhani | 439/67 |
| 5,245,135 | 9/1993 | Schreiber et al. | 29/831 X |
| 5,288,235 | 2/1994 | Sobhani | 439/67 |
| 5,326,412 | 7/1994 | Schreiber et al. | 29/848 X |
| 5,342,207 | 8/1994 | Sobhani | 439/74 |
| 5,354,205 | 10/1994 | Feigenbaum et al. | 29/831 X |
| 5,372,512 | 12/1994 | Wilson et al. | 439/67 |

FOREIGN PATENT DOCUMENTS

| | | | |
|---|---|---|---|
| 0529577A2 | 3/1993 | European Pat. Off. | 439/74 |
| 2947811 | 6/1981 | Germany | 29/881 |

*Primary Examiner*—J. Elpel
*Attorney, Agent, or Firm*—M. E. Lachman; M. W. Sales; W. K. Denson-Low

[57] ABSTRACT

Electronic interconnection of two printed wiring structures. Two printed wiring boards or a flexprint circuit and a printed wiring board are interconnected by creating a plated hole pattern on a surface of the printed wiring board, and wherein holes of the pattern have a concave cross section. The holes of the plated hole pattern are mated with corresponding bumps or dimples disposed on the second printed wiring board or the flexprint circuit. The holes formed in the first printed wiring board are disposed a predetermined depth below a surface of the printed wiring board, typically to a depth of between 0.007 inches and 0.020 inches below the surface. The plurality of plated holes are formed by electroless plating or electroplating of the holes. The present interconnection structure provides for reliable and self aligning interconnection of the two printed wiring boards or the flexprint circuit and printed wiring board.

3 Claims, 2 Drawing Sheets

CAVITY AND BUMP INTERCONNECTION STRUCTURE FOR ELECTRONIC PACKAGES

This is a continuation-in-part of application Ser. No. 08/168,342, filed Dec. 17, 1993, now abandoned.

BACKGROUND OF THE INVENTION

1. Field of the Invention

The present invention relates to electronic packaging, and more particularly, to a cavity and bump interconnection structure for use in electronic packaging.

2. Description of Related Art

The interconnection of the electronic components, especially high density electronic components and printed wiring boards, presents recurring problems for which many conventional solutions exist. Prior art interconnections techniques that have been used to interconnect two printed wiring boards or a flexprint and a printed wiring board include soldering connectors to both subassemblies and then subsequently mating the connectors. The use of connectors results in bulky, heavy, relatively expensive, and in many cases, an impractical solution. For example, conventional micro-connectors, because of their small size, require soldering or other expensive wiring techniques. Most micro-connectors cannot handle a 3 mil to 5 mil (0.0762 mm to 0.1270 mm) or smaller line width and spacing in an efficient manner.

Many conventional interconnection systems utilize pads or electrically conductive dots, such as the well-known gold-dot interconnection structure, as a means of providing the interconnection, such as is disclosed in U.S. Pat. Nos. 4,125,310 and 4,453,795. These patents describe a plurality of generally resilient metallic raised projections. In the latter patent, a resilient backup mechanism is used to avoid overstressing and squashing of the resilient projections or contacts beyond their elastic limit, which overstressing precludes repeated mating and unmating of connectors incorporating such projections. While these terminations otherwise effectively and reliably interconnect mating circuits, their manufacture can be difficult, time consuming and costly. Furthermore, the manufacturing process for forming such bumps is limited to a size of about 2 mil (0.0508 mm) in diameter. These bumps also require proper support, without exposing them to delamination due to outgassing from support materials during or after production or to inattention to thermal matching with its surrounding materials, or to possible electrical or chemical interaction with the surrounding materials.

Another interconnection technique is described in copending U.S. patent application Ser. No. 07/989,612, filed Dec. 14, 1992, now U.S. Pat. No. 5,288,235 assigned to the assignee of the present invention. This invention comprises an electrical connector for a flat cable or circuit having contacts or interconnects formed as a bulge arrangement or configuration. The bulge-type contacts or interconnects are shaped to provide a pointed, serial or continuous bulge configuration, such as one or more upsets, wrinkles, folds and creases, e.g., V-shaped and hollow shaped, both in one or more of conductors in the circuit and in any insulation underlying the conductors. The shape of the bulge configuration is maintained by a support, which also is selected to physically and chemically match with materials surrounding it.

The bulge configurations result from forming the cable to provide one or more bulges in the circuit having concave and convex portions configured as single upsets, or a series of single upsets, or a linear bulge having a V-shaped appearance, or a linear bulge. The support is shaped in accordance with the bulge into which it fits. Thus, it may comprise a dielectric resin for fitting into the pointed upsets or an extending bar with a V-shaped part, which respectively fits into the bulge concave portions or portion. A backing may be applied to the underside of the cable under the single upset, or the bar itself may be affixed to the underside of the circuit by an adhesive or secured into a mating bar on the upper side of the circuit.

The bulge configuration may comprise a series of upsets or a linear or curved wrinkle, fold or crease extending in a pattern across at least some of the conductors and the underlying dielectric circuit material on only one side of the conductors is exposed, although the conductor may be exposed on both sides to enable, for example, a plurality of the circuits to be stacked together and their bulges to interfit and electrically interconnect with adjacent bulges. The pattern may extend across the width of the circuit in any desired fashion, such as at right angles, diagonally, undulating, in the form of a "V", curve, or an arc.

The present invention is intended to provide an additional interconnection technique that is particularly well-adapted for interconnecting two printed wiring boards or a flexprint circuit and a printed wiring board. Therefore, it is an objective of the present invention to provide an improved cavity and bump interconnection structure for use in electronic packaging. It is a further objective of the present invention to provide an interconnection structure that provides for the interconnection of two printed wiring boards or a flexprint circuit and a printed wiring board.

SUMMARY OF THE INVENTION

In order to meet the above and other objectives, electronic interconnection between two printed wiring boards or a flexprint circuit and a printed wiring board is achieved in accordance with the present invention by creating a plated hole pattern on the printed wiring board wherein the holes have a concave form. Holes of the plated hole pattern are mated with corresponding bumps or dimples disposed on the printed wiring board or the flexprint circuit. This interconnection structure provides for reliable and self aligning interconnection of the two printed wiring boards or the flexprint circuit and printed wiring board.

More particularly, the present invention comprises an interconnection structure for use in interconnecting first and second printed wiring structures. The interconnection structure comprises a plated hole pattern comprising a plurality of plated holes disposed in the first printed wiring structure. The holes in the first printed wiring structure have a concave cross section. A plurality of bumps are disposed on the second printed wiring structure that are adapted to mate with the plurality of plated holes disposed in the first printed wiring structure. The holes formed in the first printed wiring board are disposed a predetermined depth below a surface of the printed wiring board, typically to a depth of between 0.007 inches and 0.020 inches below the surface. The plurality of plated holes are formed by electroless plating or electroplating of the holes.

The present interconnection structure provides for high density interconnection of two printed wiring boards or a flexprint circuit and a printed wiring board. The present invention provides an interconnection structure that has relatively low cost, requires no soldering or wiring, provides for high reliability interconnections, uses no connectors, and is self aligning.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DESCRIPTION OF THE PREFERRED EMBODIMENTS

Figure 1:
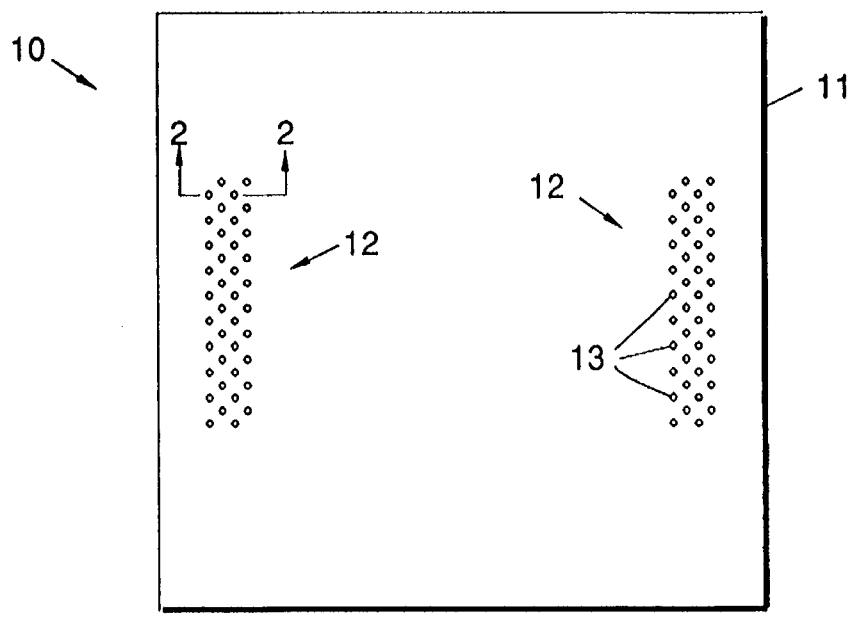
FIG. 1 illustrates a cavity and bump interconnection structure for interconnecting two printed wiring structures in accordance with the principles of the present invention.
Figure 2:
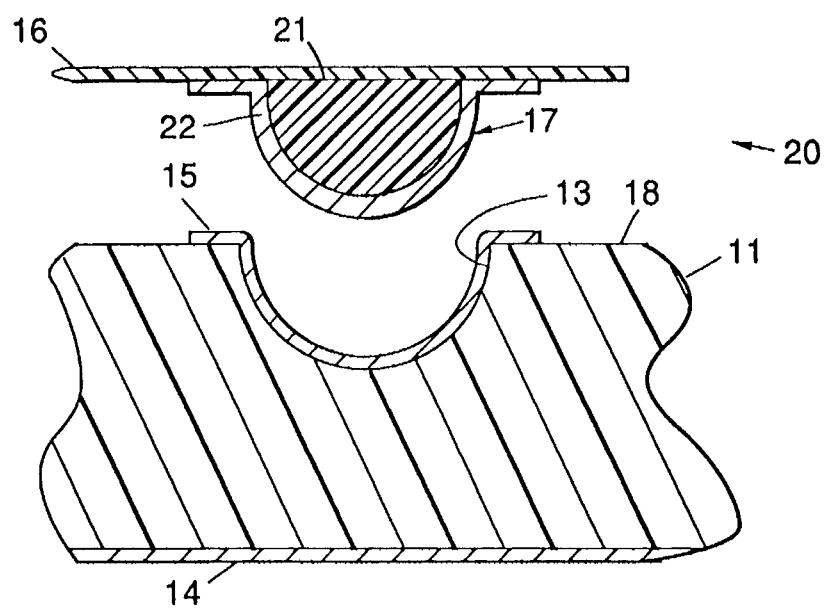
FIG. 2 shows an enlarged view of a cavity and a bump employed in the of the present invention prior to mating.
Figure 3:
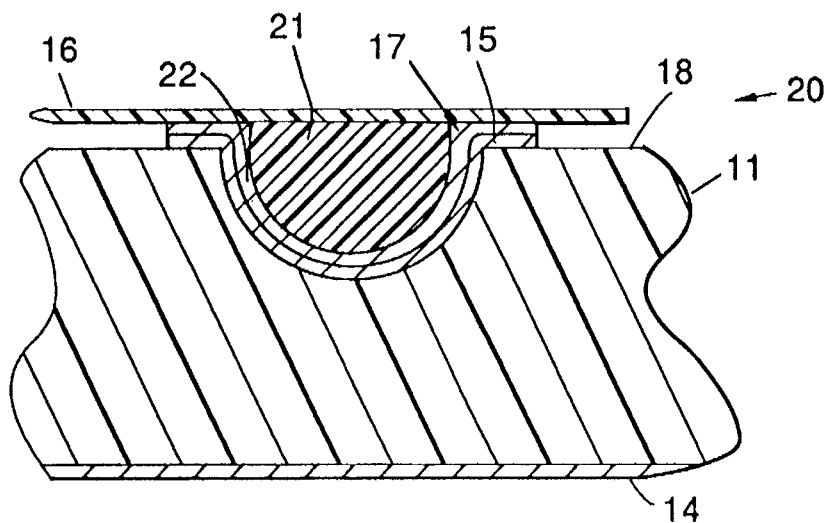
FIG. 3 shows an enlarged view of the cavity and bump of FIG. 2 after mating.
Figure 4:
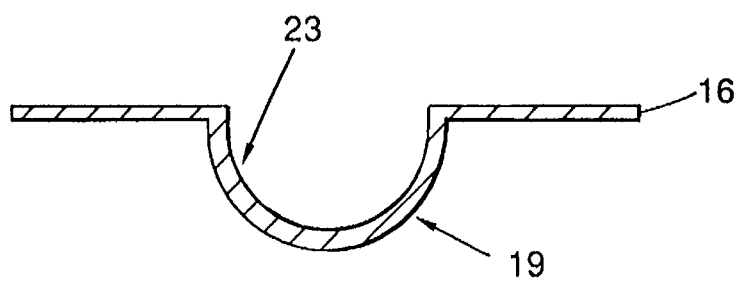
FIG. 4 shows an enlarged view of a dimple employed in the present invention, prior to mating.

Referring to the drawing figures, FIG. 1 illustrates a cavity and bump interconnection structure 10 for interconnecting printed wiring structures 11, 16, 20 in accordance with the principles of the present invention. The present interconnection structure 10 may be used to interconnect printed wiring structures 11, 16, 20 such as two printed wiring boards 11, 16, or a flexprint circuit 20 and a printed wiring board 11, for example. The printed wiring board 11 typically has a ground plane 14 disposed on one surface thereof.

To implement interconnection structure 10, cavities 13 are created by drilling 0.007 inch to 0.020 inch deep holes 13 into a first surface 18 of the printed wiring board 11. This creates hole patterns 12 on the printed wiring board 11, wherein the holes 13 have a concave cross section. The printed wiring board 11 has first and second opposing surfaces (18,14) and the cavity 13 terminates between the two opposing surfaces, that is, the hole 13 is not a through-hole. The holes 13 are then electroless plated or electroplated with conductive material 15, such as copper or aluminum, for example. After electroless or electroplating the conductive material 15 onto the surface 18, the holes 13 are ready for accepting mating bumps 17 or dimples 19 formed on a second printed wiring board 16 or a flexprint circuit 20. The bump 17 comprises a projection of a substantially inelastic dielectric material 21, such as an epoxy, which is plated with a metal 22 such as copper. The bump 17 is formed using known methods, as described, for example, in U.S. Pat. No. 5,342,207, assigned to the present assignee, the contents of which are incorporated herein by reference. The dimples 19 comprise hollow cavities 23 and are formed by known methods, such as described, for example, in U.S. Pat. No. 5,213,511, assigned to the present assignee, the contents of which are incorporated herein by reference.

The holes 13 of the plated hole pattern 12 are easily mated with the corresponding bumps 17 or dimples 19 disposed on the second printed wiring board 16 or flexprint circuit 20 by pressing them together with a predetermined amount of pressure, on the order of ten to fifteen pounds per square inch. This interconnection structure 10 thus provides for reliable and self aligning interconnection of the two printed wiring boards 11, 16 or a flexprint circuit 20 and printed wiring board 11.

The present interconnection structure 10 provides for high density interconnection of two printed wiring boards 11, 16 or a flexprint circuit 20 and a printed wiring board 11. The present invention provides an interconnection structure that has relatively low cost, requires no soldering or wiring, provides for high reliability interconnections, uses no connectors, and is self aligning.

To prove out the principles of the present invention, six panel assemblies were made with solder plating of both cavities 13 and bumps 17 to the respective printed wiring structures 11, 16. The assemblies have been tested for electrical continuity, and have undergone thermal and humidity tests. Test results indicate that the interconnection structure 10 has passed thermal cycling from −40° C. to +90° C., and humidity and vibration tests specified by MIL-P-55110. In addition, the interconnection structure 10 has passed 250 cycles of connect-interconnect tests without any appreciable changes in the resistivity thereof.

Thus there has been described a new and improved interconnection structure for use in electronic packaging that employs plated cavities and bumps. It is to be understood that the above-described embodiment is merely illustrative of some of the many specific embodiments that represent applications of the principles of the present invention. Clearly, numerous and other arrangements may be readily devised by those skilled in the art without departing from the scope of the invention.

What is claimed is:

1. An interconnection structure for use in interconnecting a plurality of printed wiring structures, said interconnection structure comprising:

a plated hole pattern comprising a plurality of plated holes disposed in a first printed wiring structure comprising a printed wiring board having first and second opposing surfaces, wherein said plated holes have a surface having a concave cross section and said plated holes terminate at a depth of between 0.007 to 0.20 inches below said first surface of said first printed wiring structure; and a plurality of bumps disposed on a second printed wiring structure that are adapted to mate with the plurality of plated holes disposed in the first printed wiring structure wherein said second printed wiring structure is selected from the group consisting of a printed wiring board and a flexprint circuit, and said bumps are selected from the group consisting of projections of a substantially inelastic dielectric material having metal plated thereon and dimples, and wherein pressure applied to said first and second printed wiring structures brings said plated holes and said bumps into contact with each other along the entirety of said surface having a concave cross-section to establish said interconnection.

2. The interconnection structure of claim 1 wherein the plurality of plated holes comprise an electroless plated conductive material.

3. The interconnection structure of claim 1 wherein the plurality of plated holes comprise an electroplated conductive material.

* * * * *